US011092645B2

(12) United States Patent
Cheng et al.

(10) Patent No.: US 11,092,645 B2
(45) Date of Patent: Aug. 17, 2021

(54) CHAIN TESTING AND DIAGNOSIS USING TWO-DIMENSIONAL SCAN ARCHITECTURE

(71) Applicant: Mentor Graphics Corporation, Wilsonville, OR (US)

(72) Inventors: Wu-Tung Cheng, Lake Oswego, OR (US); Yu Huang, West Linn, OR (US)

(73) Assignee: Siemens Industry Software Inc., Plano, TX (US)

( * ) Notice: Subject to any disclaimer, the term of this patent is extended or adjusted under 35 U.S.C. 154(b) by 76 days.

(21) Appl. No.: 16/695,322

(22) Filed: Nov. 26, 2019

(65) Prior Publication Data

US 2020/0166571 A1 May 28, 2020

Related U.S. Application Data

(60) Provisional application No. 62/771,624, filed on Nov. 27, 2018.

(51) Int. Cl.
*G01R 31/3177* (2006.01)
*G01R 31/317* (2006.01)
*G01R 31/3185* (2006.01)

(52) U.S. Cl.
CPC ... *G01R 31/3177* (2013.01); *G01R 31/31725* (2013.01); *G01R 31/31727* (2013.01); *G01R 31/318547* (2013.01); *G01R 31/318563* (2013.01)

(58) Field of Classification Search
CPC ........ G01R 31/3177; G01R 31/318547; G01R 31/318563; G01R 31/31725; G01R 31/31727
See application file for complete search history.

(56) References Cited

U.S. PATENT DOCUMENTS

| 8,566,657 B2 | 10/2013 | Goel |
| 9,222,978 B2 | 12/2015 | Huang et al. |
| 2010/0192030 A1* | 7/2010 | Kapur ............ G01R 31/318547 714/726 |
| 2020/0333398 A1* | 10/2020 | Huang ........... G01R 31/318544 |

OTHER PUBLICATIONS

Y. Huang et al., "Reversible Scan Based Diagnostic Patterns," 2019 International Symposium on VLSI Design, Automation and Test (VLSI-DAT), Hsinchu, Taiwan, 2019, pp. 1-4. (Year: 2019).*
Yu Huang and Wu-Tung Cheng, "On designing two-dimensional scan architecture for test chips", 2017 International Symposium on VLSI Design, Automation and Test (VLSI-DAT), Jun. 8, 2017.

* cited by examiner

*Primary Examiner* — Cynthia Britt

(57) ABSTRACT

A test pattern is shifted into scan chains in a circuit in a first direction. The scan cells on each of the scan chains are further coupled to corresponding scan cells on two other scan chains in the scan chains such that data bits stored in the scan cells can be shifted circularly in a second direction orthogonal to the first direction based on a control signal. The loaded test pattern is then shifted in the second direction for a number of clock cycles equal to the number of the scan chains. The test pattern is then shifted in the first direction out of the scan chains to generate a chain test result. Faulty scan cell candidates on faulty scan chains may be determined based on part of the chain test result for one of good scan chains.

12 Claims, 8 Drawing Sheets chain pattern 001100110011

| Fault Models | Unloaded Values with One Permanent Faults | Unloaded Values with One Intermittent Fault (Examples) |
|---|---|---|
| Slow-to-Rise | 00100010001X | 00110010001X |
| Slow-to-Fall | 01110111011X | 01110011011X |
| Slow | 01100110011X | 00100111011X |
| Fast-to-Rise | X01110111011 | X01110110011 |
| Fast-to-Fall | X00100010001 | X00100110001 |
| Fast | X00110011001 | X00100111001 |
| Stuck-at-0 | 00000000000 | 001000010000 |
| Stuck-at-1 | 11111111111 | 101111111011 |

FIG. 5

CHAIN TESTING AND DIAGNOSIS USING TWO-DIMENSIONAL SCAN ARCHITECTURE

RELATED APPLICATIONS

This application claims the benefit of U.S. Provisional Patent Application No. 62/771,624, filed on Nov. 27, 2018, which application is incorporated entirely herein by reference.

FIELD OF THE DISCLOSED TECHNIQUES

The presently disclosed techniques relates to circuit testing. Various implementations of the disclosed techniques may be particularly useful for scan chain diagnosis.

BACKGROUND OF THE DISCLOSED TECHNIQUES

Building circuits on silicon as test chips can provide insight into how a new fabrication process works. Traditionally, semiconductor manufacturers relied mainly on SRAM (static random-access memory) test chips for ramping up, qualifying and monitoring new semiconductor fabrication processes. The transistor and circuit geometries used on an SRAM test chip, however, represent only a small fraction of the transistor and circuit geometries found in a real product. In recent years, test chips with logic circuit components (logic test chips hereinafter) are often utilized to supplement or replace SRAM test chips. While more closely representing chips with real circuit designs, the logic test chips are not as easily testable or diagnosable as the SRAM test chips.

To check whether a logic test chip is fabricated according to the design and to locate potential defects, scan testing is usually employed. In this technique, a series of known values (test stimuli or test pattern) are shifted-in (or loaded into) state elements called scan cells through their sequential inputs. These scan cells are interconnected into scan chains for scan testing. The shifting-in occurs by placing the integrated circuit in a special mode, known as shift mode, and then applying a series of clock pulses, called "shift pulses" or "shift clock pulses." Each shift clock pulse pushes a bit of test stimuli into a scan cell in each of the scan chains. This continues until all scan cells in the scan chains are filled with test pattern bits. Then, one or more clock pulses, called "capture pulses" or "capture clock pulses," are applied to the circuit as they would be in normal operation. This is referred to as capture mode. After the test pattern bits are injected into the circuit, the results of the test (test responses) are "captured" and stored in the scan cells. The circuit then returns to shift mode, and with each additional clock pulse, a bit of the test responses is pushed or shifted out as each bit of new test pattern is pushed or shifted in. The shifted out test responses are then compared with expected results to determine and locate any errors. Shift mode and capture mode together may be called as test mode.

Scan chains and their associated clock circuitry are themselves a major source of circuit failures. It has been reported that defects occurring on scan chains account for about 30% to 50% of all failing chips. Thus, scan chains need to be tested and diagnosed first. As discussed in detail below, faulty scan chains can be detected using relatively simple methods. Locating defective scan cells, however, are challenging. Physical failure analysis instruments, combined with a tester, are sometimes used to search for defective responses along scan chains. These hardware-based methods often rely on specially-designed scan chains and scan cells. While effective in isolating scan chain defects, the requirement of extra hardware may not be acceptable in many realistic products. Further, it is difficult to apply these methods to chips with embedded compression circuits without resorting to a bypass mode.

Software-based techniques use algorithmic diagnosis procedures to identify failing scan cells. It may run chain diagnosis with conventional scan chains with or without embedded compressions. The current software-based chain diagnosis techniques may be further classified into two categories: model-based algorithms and data-driven algorithms. In a model-based chain diagnosis process, fault models and pattern simulation are used. In a data-driven chain diagnosis process, signal profiling, filtering and edge detections are applied. Each category of algorithms has its own advantages and disadvantages. These two can also be combined to increase diagnosis resolution and accuracy. While conventional methods may achieve satisfactory results for a defect behaving exactly like a modeled fault (e.g. stuck-at-0 fault at a scan cell's output), a defect in a scan chain often exhibits un-modeled faulty behavior (e.g. intermittent faulty behavior). For the un-modeled faults, both the diagnostic accuracy and resolution could degrade significantly.

Two-dimensional scan architecture, described in U.S. Pat. No. 9,222,978, titled "Two-dimensional scan architecture", can significantly increase chain diagnosis resolution. The architecture, however, requires much more input/output scan channels than the conventional one-dimensional scan architecture. Typically, the number of scan cells on a scan chain is greater than the number of scan chains. As such, the number of input/output scan channels for the two-dimensional scan architecture more than double the number of input/output scan channels for the one-dimensional scan architecture. To meet the requirement, the design need more input/output pins or logic to enable pin sharing. The formal may not be feasible due to the tester while the latter increases the cost of silicon area overhead. Moreover, the two-dimensional scan architecture also needs another set of test compression logic.

BRIEF SUMMARY OF THE DISCLOSED TECHNIQUES

Various aspects of the disclosed technology relate to chain testing and diagnosing in a two-dimensional scan architecture. In one aspect, there is a method, comprising: shifting, in a first direction, a test pattern into scan chains in a circuit, the scan chains comprising scan cells, wherein the scan cells on each of the scan chains are further coupled to corresponding scan cells on two other scan chains in the scan chains such that data bits stored in the scan cells can be shifted circularly in a second direction orthogonal to the first direction based on a control signal, shifting, in the second direction, the test pattern for a number of clock cycles equal to a number of the scan chains; and shifting, in the first direction, the test pattern out of the scan chains to generate a chain test result.

The method may further comprise: determining good scan chains and faulty scan chains based on the chain test result, the good scan chains being scan chains having no faulty scan cells; and identifying faulty scan cell candidates on the faulty scan chains based on part of the chain test result for one of the good scan chains. The method may still further comprise: shifting, in the first direction, another test pattern into the scan chains; shifting, in a pseudo-diagonal direction, the another test pattern for a number of clock cycles determined based on the faulty scan cell candidates or the faulty scan chains to generate a portion of another chain test result, wherein the shifting in the pseudo-diagonal direction comprises: repeating an operation of shifting the another test pattern for one clock cycle in the first direction followed by shifting for one clock cycle in the second direction or an operation of shifting for one clock cycle in the second direction followed by shifting for one clock cycle in the first direction; shifting, in the first direction, the another test pattern out of the scan chains to generate rest of the another chain test result; and determining final faulty scan cell candidates in the faulty scan cell candidates based on the another chain test result. The test pattern and the another test pattern may be identical.

Alternatively, the method may further comprise: shifting, in the first direction, another test pattern into the scan chains; shifting, in a pseudo-diagonal direction, the another test pattern for a number of clock cycles equal to two times the number of the scan chains to generate a portion of another chain test result, wherein the shifting in the pseudo-diagonal direction comprises: repeating an operation of shifting the another test pattern for one clock cycle in the first direction followed by shifting for one clock cycle in the second direction or repeating an operation of shifting for one clock cycle in the second direction followed by shifting for one clock cycle in the first direction; and shifting, in the first direction, the another test pattern out of the scan chains to generate rest of the another chain test result. The method may still further comprise: determining good scan chains and faulty scan chains based on the chain test result, the good scan chain being a scan chain having no faulty scan cells; and determining faulty scan cell candidates on the faulty scan chains based on part of the chain test result for one of the good scan chains and the another chain test result.

In another aspect, there is a method, comprising: shifting, in a first direction, a test pattern into scan chains in a circuit, the scan chains comprising scan cells, wherein the scan cells on each of the scan chains are further coupled to corresponding scan cells on two other scan chains in the scan chains such that data bits stored in the scan cells can be shifted circularly in a second direction orthogonal to the first direction based on a control signal; shifting, in a pseudo-diagonal direction, the test pattern for a number of clock cycles equal to two times a number of the scan chains to generate a portion of a chain test result, wherein the shifting in the pseudo-diagonal direction comprises: repeating an operation of shifting the test pattern for one clock cycle in the first direction followed by shifting for one clock cycle in the second direction or repeating an operation of shifting for one clock cycle in the second direction followed by shifting for one clock cycle in the first direction; and shifting, in the first direction, the test pattern out of the scan chains to generate rest of the chain test result.

The method may further comprise: shifting, in the first direction, another test pattern into the scan chains; and shifting, in the first direction, the another test pattern out of the scan chains to generate another chain test result. The test pattern and the another test pattern may be identical. The method may still further comprise: determining good scan chains and faulty scan chains based on the another chain test result, the good scan chain being a scan chain having no faulty scan cells; and determining faulty scan cell candidates on the faulty scan chains based on the chain test result.

Alternatively, the method may further comprise: determining faulty scan cell candidates based on the chain test result.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed techniques. Thus, for example, those skilled in the art will recognize that the disclosed techniques may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIG. 5 illustrates a table listing unloaded patterns for eight permanent fault models and eight intermittent fault models obtained by shifting in and out a chain pattern ("001100110011") assuming one permanent fault.

DETAILED DESCRIPTION OF THE DISCLOSED TECHNIQUES

Figure 1:
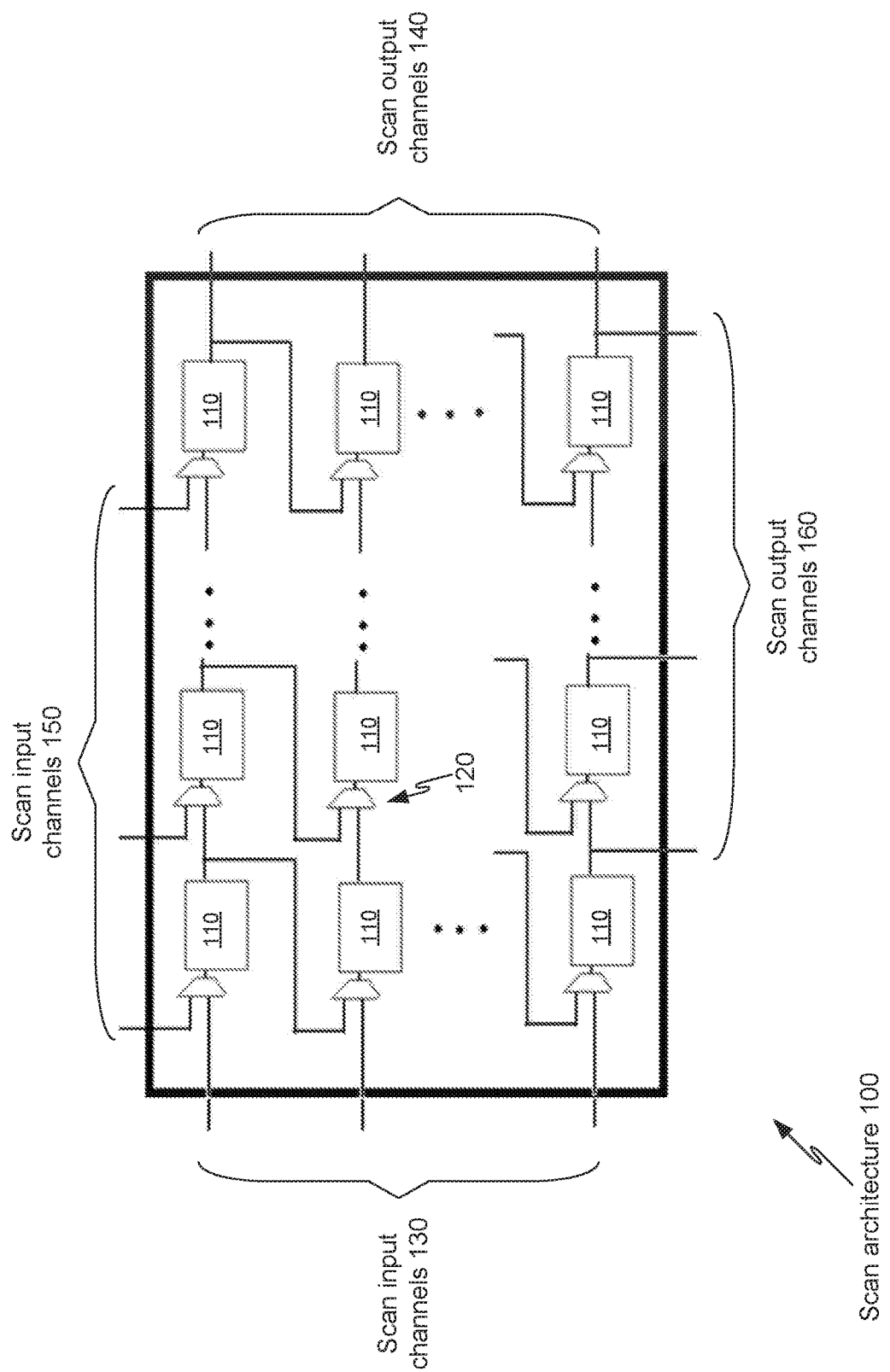
FIG. 1 illustrates an example of a two-dimensional scan architecture in which a test pattern can be shifted into scan cells in two orthogonal directions.

Various aspects of the disclosed technology relate to chain testing and diagnosing in a two-dimensional scan architecture. In the following description, numerous details are set forth for the purpose of explanation. However, one of ordinary skill in the art will realize that the disclosed technology may be practiced without the use of these specific details. In other instances, well-known features have not been described in details to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

The detailed description of a method or a device sometimes uses terms like "load" and "generate" to describe the disclosed method or the device function/structure. Such terms are high-level descriptions. The actual operations or functions/structures that correspond to these terms will vary depending on the particular implementation and are readily discernible by one of ordinary skill in the art.

Additionally, as used herein, the term "design" is intended to encompass data describing an entire integrated circuit device. This term also is intended to encompass a smaller group of data describing one or more components of an entire device such as a portion of an integrated circuit device nevertheless.

The reduction in feature size increases the probability that a manufacture defect in the integrated circuit will result in a faulty chip. A very small defect can result in a faulty transistor or interconnecting wire. Even a single faulty transistor or wire can cause the entire chip to function improperly. Manufacture defects are unavoidable nonetheless, no matter whether the manufacturing process is at the prototype stage or the high-volume manufacturing stage. It is thus necessary to test chips during the manufacturing process. Diagnosing faulty chips is also needed to ramp up and to maintain the manufacturing yield.

Testing typically includes applying a set of test stimuli (test patterns) to the circuit-under-test and then analyzing responses generated by the circuit-under-test. Functional testing attempts to validate that the circuit-under-test operates according to its functional specification while structural testing tries to ascertain that the circuit-under-test has been assembled correctly from some low-level building blocks as specified in a structural netlist and that these low-level building blocks and their wiring connections have been manufactured without defect. For structural testing, it is assumed that if functional verification has shown the correctness of the netlist and structural testing has confirmed the correct assembly of the structural circuit elements, then the circuit should function correctly. Structural testing has been widely adopted at least in part because it enables the test (test pattern) generation to focus on testing a limited number of relatively simple circuit elements rather than having to deal with an exponentially exploding multiplicity of functional states and state transitions.

To make it easier to develop and apply test patterns, certain testability features are added to circuit designs, which is referred to as design for test or design for testability (DFT). Scan testing is the most common DFT method. In a basic scan testing scheme, all or most of internal sequential state elements (latches, flip-flops, et al.) in a circuit design are made controllable and observable via a serial interface. These functional state elements are usually replaced with dual-purpose state elements called scan cells. Scan cells are connected together to form scan chains—serial shift registers for shifting in test patterns and shifting out test responses. A scan cell can operate as originally intended for functional purposes (functional/mission mode) and as a unit in a scan chain for scan (scan mode). A widely used type of scan cell include an edge-trigged flip-flop with two-way multiplexer for the data input. The two-way multiplexer is typically controlled by a single control signal called scan_enable, which selects the input signal for a scan cell from either a scan signal input port or a system signal input port. The scan signal input port is typically connected to an output of another scan cell while the system signal input port is connected to the functional logic. Scan cells can serve as both a control point and an observation point. Control points can be used to set certain logic values at some locations of the circuit-under-test, exciting (activating) a fault and propagating the incorrect value to an observation point. Scan testing allows the test equipment to access gates deeply embedded through the primary inputs/outputs and/or some physical test points and can remove the need for complicated state transition sequences when trying to control or observe what is happening at some internal circuit element.

Test patterns for scan testing are typically generated through an automatic test pattern generation (ATPG) process. ATPG usually focuses on a set of faults derived from a gate-level fault model. A defect is an error caused in a device during the manufacturing process. A fault model is a description of how a defect alters design behavior. In another word, a defect is a flaw or physical imperfection that may lead to a fault. For a given target fault, ATPG comprises two phases: fault activation and fault propagation. Fault activation establishes a signal value at the fault site opposite that produced by the fault. Fault propagation propagates the fault effect forward by sensitizing a path from a fault site to a scan cell or a primary output. A fault at a site is said to be detected by a test pattern if a test response value captured by a scan cell or a primary output is different than the expected value. The objective of ATPG is to find a test pattern that, when applied to the circuit, enables testers to distinguish between the correct circuit behavior and the faulty circuit behavior caused by one or more particular faults. Effectiveness of ATPG is measured by the fault coverage achieved for the fault model and the number of generated vectors (test pattern counts), which should be directly proportional to test application time. Here, the fault coverage is defined as a ratio of the number of detected faults vs. the total number of faults.

The most popular fault model used in practice is the single stuck-at fault model. In this model, one of the signal lines in a circuit is assumed to be stuck at a fixed logic value, regardless of what inputs are supplied to the circuit. The stuck-at fault model is a logical fault model because no delay information is associated with the fault definition. Delay faults cause errors in the functioning of a circuit based on its timing. They are caused by the finite rise and fall time periods of the signals in the gates, as well as, the propagation delay of interconnects between the gates. Transition faults are used for their simplicity in modeling spot defects that affect delays at inputs or outputs of gates. Under scan-based tests, the transition faults are associated with an extra delay that is large enough to cause the delay of any path through the fault site to exceed the clock period. Cell internal fault models can be derived using transistor-level circuit simulations (analog simulations). This approach can pinpoint the defect location within a cell for various cell internal defects.

During the circuit design and manufacturing process, a manufacturing test screens out chips (dies) containing defects. The test itself, however, does not identify the reason for the unacceptable low or fluctuating yield that may be observed. Physical failure analysis (PFA) can inspect the faulty chip to locate the defect location(s) and to discover the root cause. The process usually includes etching away certain layers and then imaging the silicon surface by scanning electronic microscopy or focused ion beam systems. This PFA process is laborious and time consuming. To facilitate the PFA process, diagnosis (also referred to as scan diagnosis) is often employed to narrow down possible locations of the defect(s) based on analyzing the fail log (fail file, failure file, or failure report). The fail log typically contains information about when (e.g., tester cycle), where (e.g., at what tester channel), and how (e.g., at what logic value) the test failed and which test patterns generate expected test responses. The layout information of the circuit design may also be employed to further reduce the number of defect suspects.

Diagnosis includes logic diagnosis (sometimes referred to as scan diagnosis or diagnosis) and chain diagnosis. Logic diagnosis may employ a fault dictionary or directly examine the syndrome (i.e., the effect) of the failing chip to determine likely defect locations (defect suspects). The latter approach may include structural pruning (backtracing), fault injection, and evaluation (fault simulation for both failing and passing test patterns). The quality of diagnosis can be measured by diagnostic resolution (the number of the real defects vs. the number of the defect suspects). Diagnostic resolution is linked not only to the algorithm used for diagnosis but also to the test patterns used for the manufacturing test (manufacturing test patterns). To enhance the diagnosis quality, a diagnostic test pattern generation process may be employed. This process generates test patterns that can refine the set of defect suspects.

Chain diagnosis determines scan cells that are likely to be defective. In a chain diagnosis process, two types of test patterns may be used. The first type is called chain patterns. A chain pattern is a pattern used in a process comprising shift-in and shift-out without pulsing capture clocks. The other type is often referred to as scan patterns. A scan pattern is a pattern used in a process comprising shift-in, one or multiple capture clock cycles, and shift-out, and the scan patterns include patterns generated by ATPG for testing system logic, special chain diagnostic patterns generated only for scan chain diagnosis purpose and some special functional patterns. Chain patterns can be used to test the integrity of scan chains and/or determine fault models associated with faulty scan chains while scan patterns can be used to inject certain values to some scan cells for locating defective scan cells.

Test application in chip manufacturing test is normally performed by automatic test equipment (ATE) (a type of testers). Scan-based tests consume significant amounts of storage and test time on ATE. The data volume increases with the number of logic gates on the chip and the same holds for the number of scan cells. Yet, practical considerations and ATE specifications often limit both the number of pins available for scan in/out and the maximum scan frequency. It is highly desirable to reduce the amount of test data that need to be loaded onto ATE and ultimately to the circuit under test. Fortunately, test patterns are compressible mainly because only 1% to 5% of test pattern bits are typically specified bits (care bits) while the rest are unspecified bits (don't-care bits). Unspecified bits can take on any values with no impact on the fault coverage. Test compression may also take advantage of the fact that test cubes tend to be highly correlated. A test cube is a deterministic test pattern in which the don't-care bits are not filled by ATPG. The correlation exists because faults are structurally related in the circuit.

Various test compression techniques have been developed. In general, additional on-chip hardware before and after scan chains is inserted. The hardware (decompressor) added before scan chains is configured to decompress test stimulus coming from ATE, while the hardware (compactor) added after scan chains is configured to compact test responses captured by the scan chains. The decompressor expands the data from n tester channels to fill greater than n scan chains. The increase in the number of scan chains shortens each scan chain and thus reduces the number of clock cycles needed to shift in each test pattern. Thus, test compression can reduce not only the amount of data stored on the tester but also the test time for a given test data bandwidth.

All of the above mentioned processes, design insertion for testing, test pattern generation, and logic diagnosis, are normally performed by various electronic design automation tools such as those in the Tessent family of software tools available from Mentor Graphics Corporation, Wilsonville, Oreg.

FIG. 1 illustrates an example of a two-dimensional scan architecture 100 in which a test pattern can be shifted into scan cells 110 in two orthogonal directions. Unlike a conventional one-dimensional scan architecture, the scan input of each scan cell 110 in the two-dimensional scan architecture 100 is coupled to a multiplexer. Multiplexer 120 is such an example. The two inputs of the multiplexer 120 are coupled to outputs of the left neighboring scan cell and the upper neighboring scan cell, respectively. Two orthogonal groups of scan paths are thus formed. In the figure, the group of horizontal scan paths start at input channels 130 and end at output channels 140, and the group of vertical scan paths start at input channels 150 and end at output channels 160. A test pattern can be shifted in from the input channels 130 or the input channels 150. The shifted-in test pattern or captured test responses can be shifted out through the output channels 140 (horizontal scan paths), the output channels 160 (vertical scan paths), or both (pseudo-diagonal scan paths).

Figure 2:
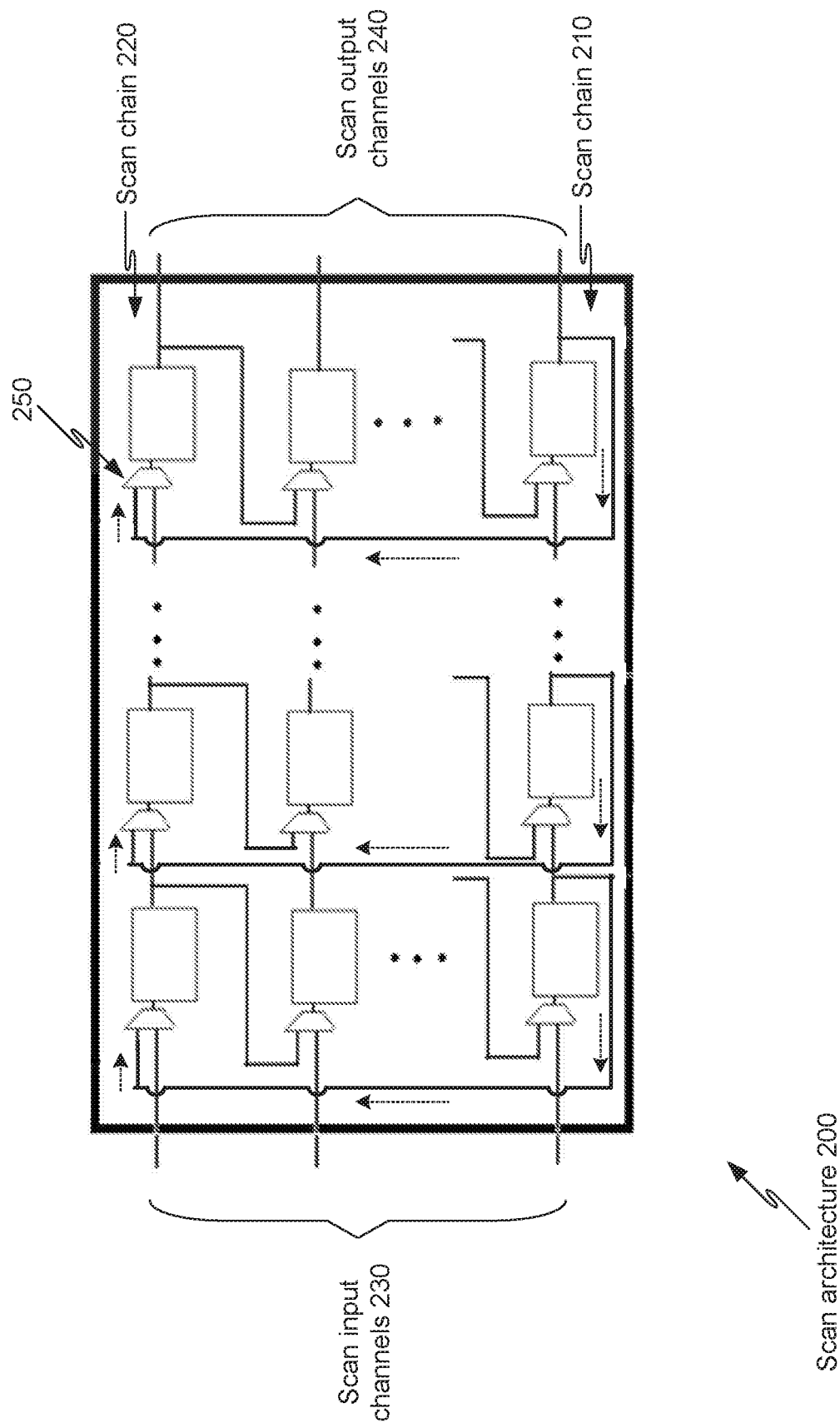
FIG. 2 illustrates an example of a two-dimensional scan architecture in which a test pattern can only be shifted into scan cells in one direction.

FIG. 2 illustrates an example of a two-dimensional scan architecture 200 in which a test pattern can only be shifted into scan cells in one direction. Unlike the two-dimensional scan architecture 100, the two-dimensional scan architecture 200 has input channels 230 and output channels 240 to allow test patterns to be shifted into and out of the two-dimensional scan architecture 200 along horizontal scan paths, but does not have channels corresponding to the input channels 150 and the output channels 160. Instead, outputs of scan cells on the scan chain 210 are coupled to inputs of corresponding scan cells on the scan chain 220 through corresponding multiplexers 230 to form circular vertical scan paths. The scan cells on each of the scan chains in the two-dimensional scan architecture 200 are thus coupled to corresponding scan cells on two other scan chains in the scan chains such that data bits stored in the scan cells can be shifted circularly in the vertical direction based on a control signal controlling multiplexers such as multiplexer 250.

Figure 3:
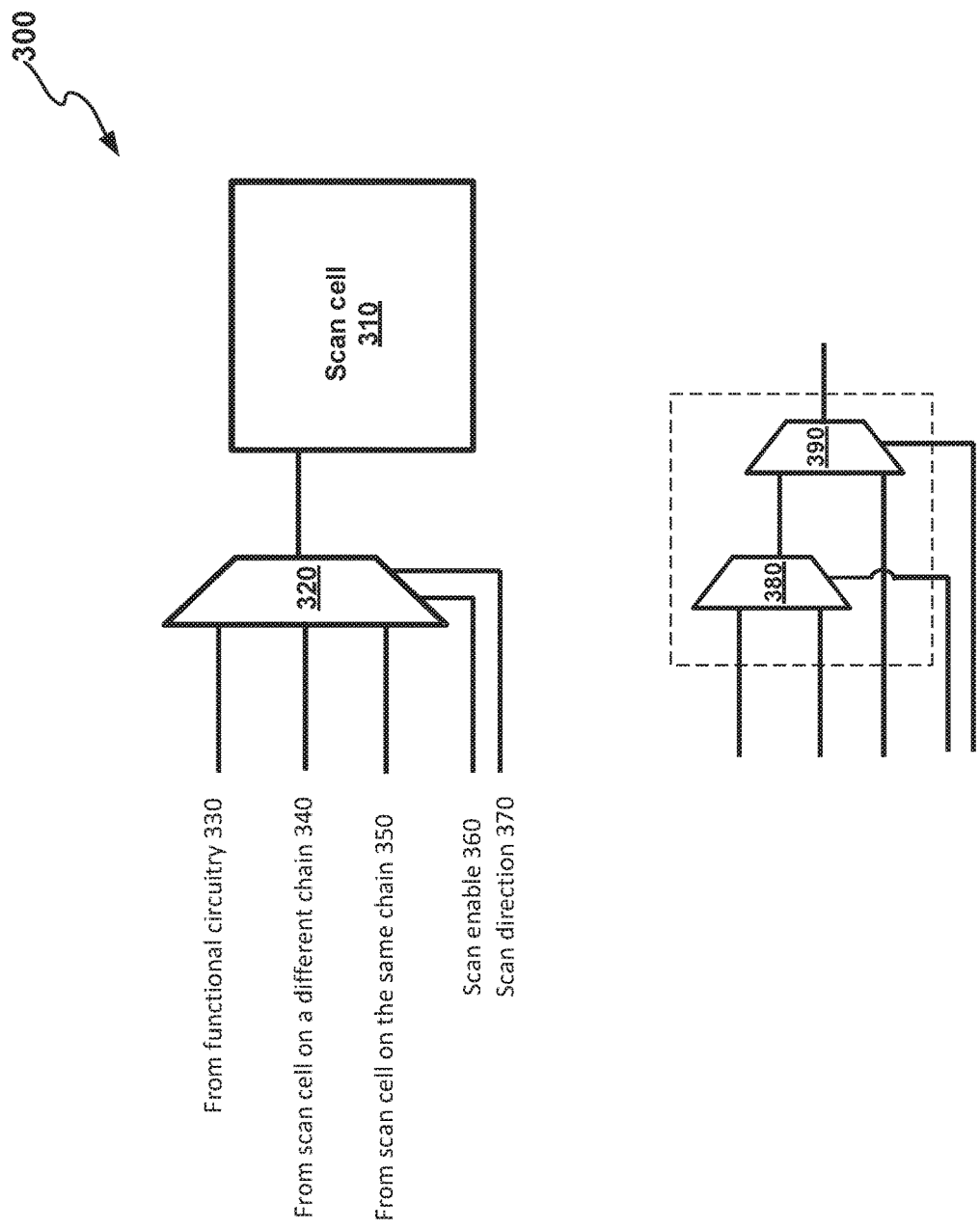
FIG. 3 illustrates examples of combining multiplexers with scan cells for two-dimensional scan architectures.

In FIGS. 1 and 2, one 2-to-1 multiplexer is coupled to a scan cell to form the two-dimensional scan architectures 100 and 200. A two-dimensional scan architecture can be formed using a slightly different circuit. FIG. 3 shows an example of a circuit 300 comprising a 3-to-1 multiplexer 310 and a scan cell 310. The three input signals for the 3-to-1 multiplexer 310 are a functional circuitry signal 330, a scan signal from a scan cell on the same horizontal scan chain 350, and a scan signal from a scan cell on a different horizontal scan chain 340. The output of the 3-to-1 multiplexer 310 is determined by a scan enable signal 360 and a scan direction signal 370. The 3-to-1 multiplexer 310 may be replaced with two 2-to-1 multiplexers 380 and 390. Any two of the three input signals for the 3-to-1 multiplexer 310 can serve as the input signals for the 2-to-1 multiplexer 380. In the two-dimensional scan architectures 100 and 200, the scan signal from a scan cell on the same horizontal scan chain 350 and the scan signal from a scan cell on a different horizontal scan chain 340 are coupled to the inputs of the 2-to-1 multiplexer 380, while the functional circuitry signal 330 is coupled to one of the two inputs of the 2-to-1 multiplexer 390.

Figure 4:
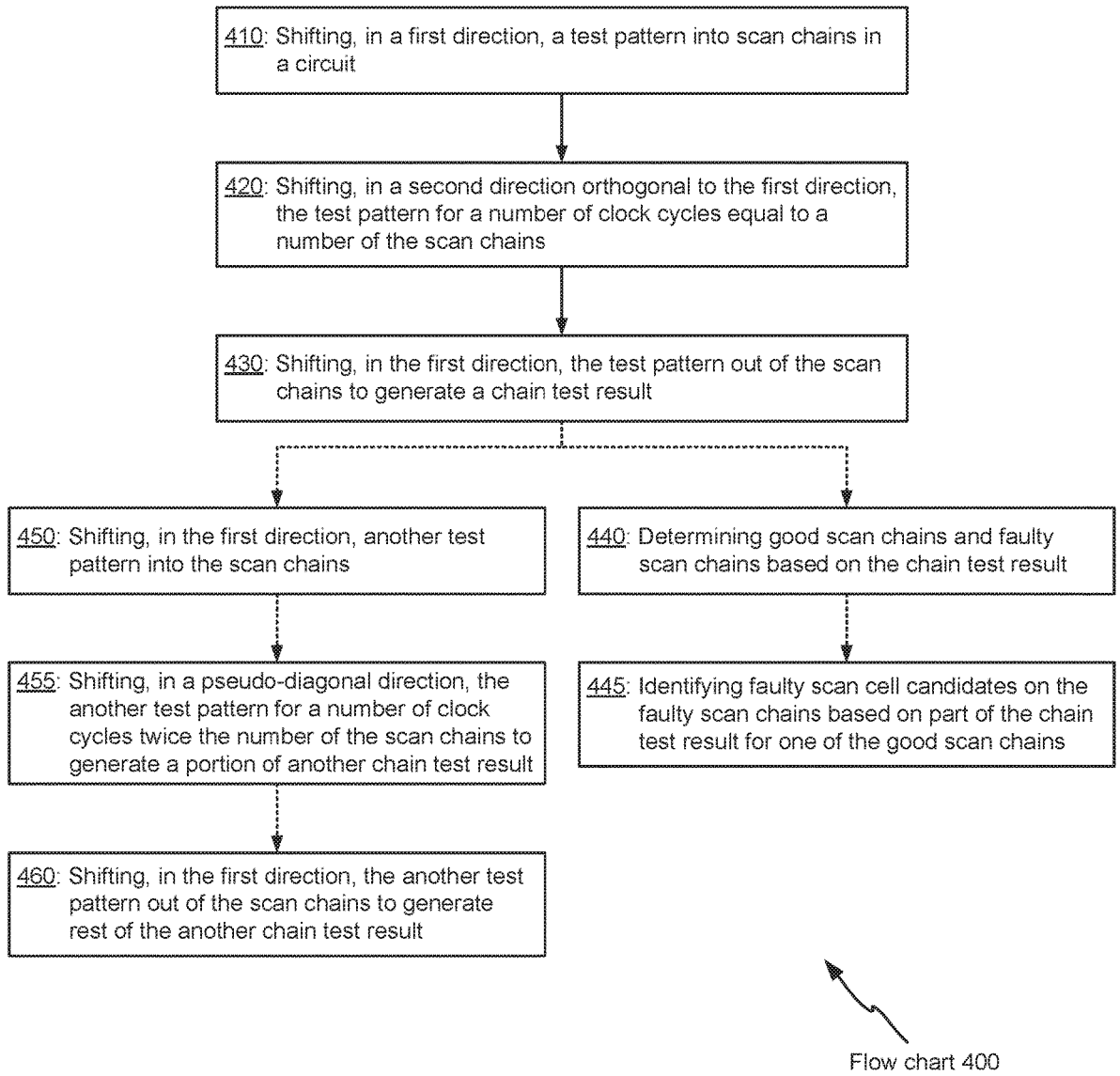
FIG. 4 illustrates a flowchart showing a process of scan chain diagnosis using a two-dimensional scan architecture that may be implemented according to various embodiments of the disclosed technology.

FIG. 4 illustrates a flowchart 400 showing a process of scan chain diagnosis using a two-dimensional scan architecture that may be implemented according to various embodiments of the disclosed technology. For ease of understanding, methods for scan chain diagnosis using a two-dimensional scan architecture that may be employed according to various embodiments of the disclosed technology will be described with reference to the two-dimensional scan architecture 200 in FIG. 2 and the flow chart 400 illustrated in FIG. 4. It should be appreciated, however, that alternate two-dimensional scan architectures may be used to perform the methods for scan chain diagnosis illustrated by the flow chart 400 according to various embodiments of the disclosed technology. Likewise, the two-dimensional scan architecture 200 may be employed to perform methods for scan chain diagnosis other than the one shown in the flow chart 400 according to various embodiments of the disclosed technology.

In operation 410, a test pattern is shifted into scan chains in a circuit having the two-dimensional scan architecture 200 in a first direction. The first direction is horizontal in the two-dimensional scan architecture 200. The test pattern loaded into the scan chains may have bits different from the original test patterns due to existence of faulty scan cells. In a conventional chain pattern test, the loaded test pattern is shifted out of the scan chains in the first direction. The unloaded first test pattern is compared with the original first test pattern. The comparison result can be analyzed to determine faulty scan chains and fault types. FIG. 5 lists unloaded patterns for eight permanent fault models and eight intermittent fault models obtained by shifting in and out a chain pattern ("001100110011") assuming one permanent fault. Using conventional one-dimensional scan architecture, however, chain patterns alone usually cannot locate the faulty scan cell.

Rather than being shifted out, in operation 420, the loaded test pattern is shifted, in a second direction, for a number of clock cycles equal to a number of the scan chains. The second direction is orthogonal to the first direction. In the two-dimensional scan architecture 200, the second direction is vertical. At each clock cycle, every bit of the loaded test pattern is shifted to a different scan chain. At the last clock cycle, the loaded test pattern will return to the scan chains originally being loaded. Values of some bits may be changed if there is a faulty scan cell on its vertical scan path.

In operation 430, the test pattern is shifted, in the first direction, out of the scan chains to generate a chain test result. The chain test result can be derived by comparing the unloaded test pattern with the original test pattern.

In operation 440, good scan chains and faulty scan chains may be determined based on the chain test result. A good scan chain is a scan chain having no faulty scan cells. In operation 445, faulty scan cell candidates on the faulty scan chains are identified based on part of the chain test result for one of the good scan chains. If one test pattern is not sufficient in some cases, the operations 410, 420 and 430 may be repeated using more test patterns.

Figure 6:
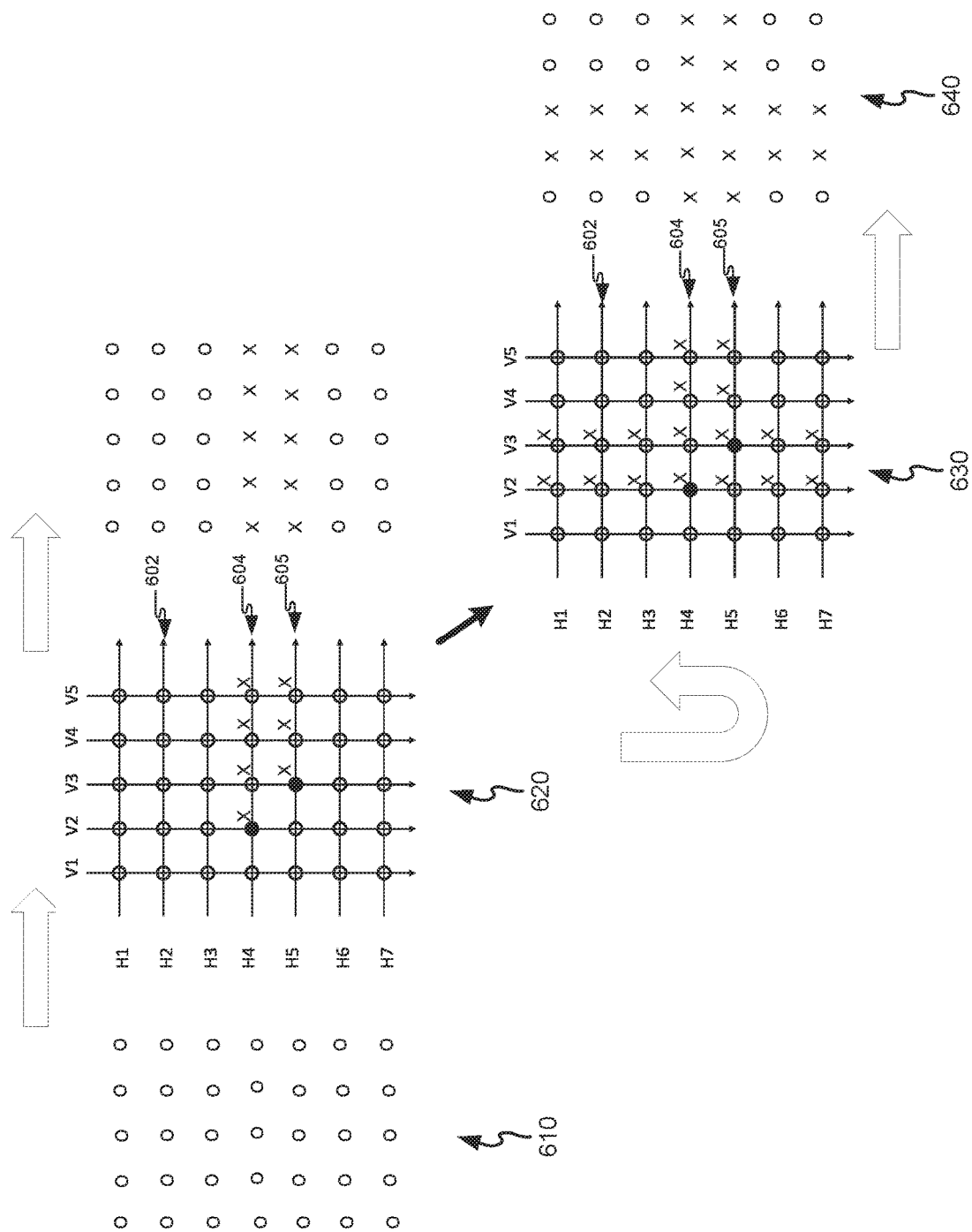
FIG. 6 illustrates an example for comparing the conventional process for a one-dimensional scan architecture with the process for a two-dimensional scan architecture according to some embodiments of the disclosed technology.

FIG. 6 illustrates an example for comparing the conventional process for a one-dimensional scan architecture with the process including the operations 410-430. The original value for each bit of a test pattern 610 is represented by a letter "o". A scan architecture 620 has two faulty scan cells at intersections between H4 and V2 and between H5 and V3 (the scan cells are referred to as H4-V2 and H5-V3). After the test pattern 610 is loaded, some of its bits on scan chains 604 and 605 will be changed due to the two faulty scan cells, each being represented by a letter "x". If the test pattern is now being shifted out as in the conventional process, each bit of the unloaded test pattern 650 corresponding to the scan chains 604 and 605 may become "x". The analysis of the result 650 can only tell that the scan chains 604 and 605 are faulty scan chains.

In the process according to various embodiments of the disclosed technology, a vertical rotation is performed. Some bits on good scan chains such as H2-V2 and H2-V3 on scan chain 602 are changed to "x" as illustrated in a scan architecture 630. An unloaded test pattern 640 keeps these two incorrect bits and also correct bits corresponding to scan cells on the scan chain 602. The locations of the two incorrect bits on the good scan chain 602 can be used to identify faulty cell candidates on the two faulty scan chains 604 and 605. For multiple defects, however, this method alone may not be able to pinpoint the faulty cells H4-V2 and H5-V3 because either all four scan cells (H4-V2, H4-V3, H5-V2 and H5-V3), or any three of the four, or any two diagonal of the four being faulty can produce the same unloaded test pattern 640.

Rather than performing the operations 440 and 445 in FIG. 4, in operation 450, another test pattern is shifted into the scan chains in the first direction. The another test pattern may be the same as the original test pattern used in operation 410 or a different test pattern. In operation 455, the loaded another test pattern is shifted in a pseudo-diagonal direction for a number of clock cycles equal to two times of the number of the scan chains to generate a portion of another chain test result. Shifting in the pseudo-diagonal direction comprises: repeating an operation of shifting the another test pattern for one clock cycle in the first direction followed by shifting for one clock cycle in the second direction or repeating an operation of shifting for one clock cycle in the second direction followed by shifting for one clock cycle in the first direction. In operation 460, the another test pattern is shifted out of the scan chains to generate rest of the another chain test result.

It should be noted that the operations 450, 455 and 460 can be performed first, prior to the operations 410, 420 and 430. It should also be noted that the operations 450, 455 and 460 may be performed after the operation 440 or the operation 445. In this case, the operation 455 can shift the loaded test pattern in the pseudo-diagonal direction for a number of clock cycles equal to or less than two times of the number of the scan chains based on the good/faulty scan chain locations to generate a portion of another chain test result.

Figure 7:
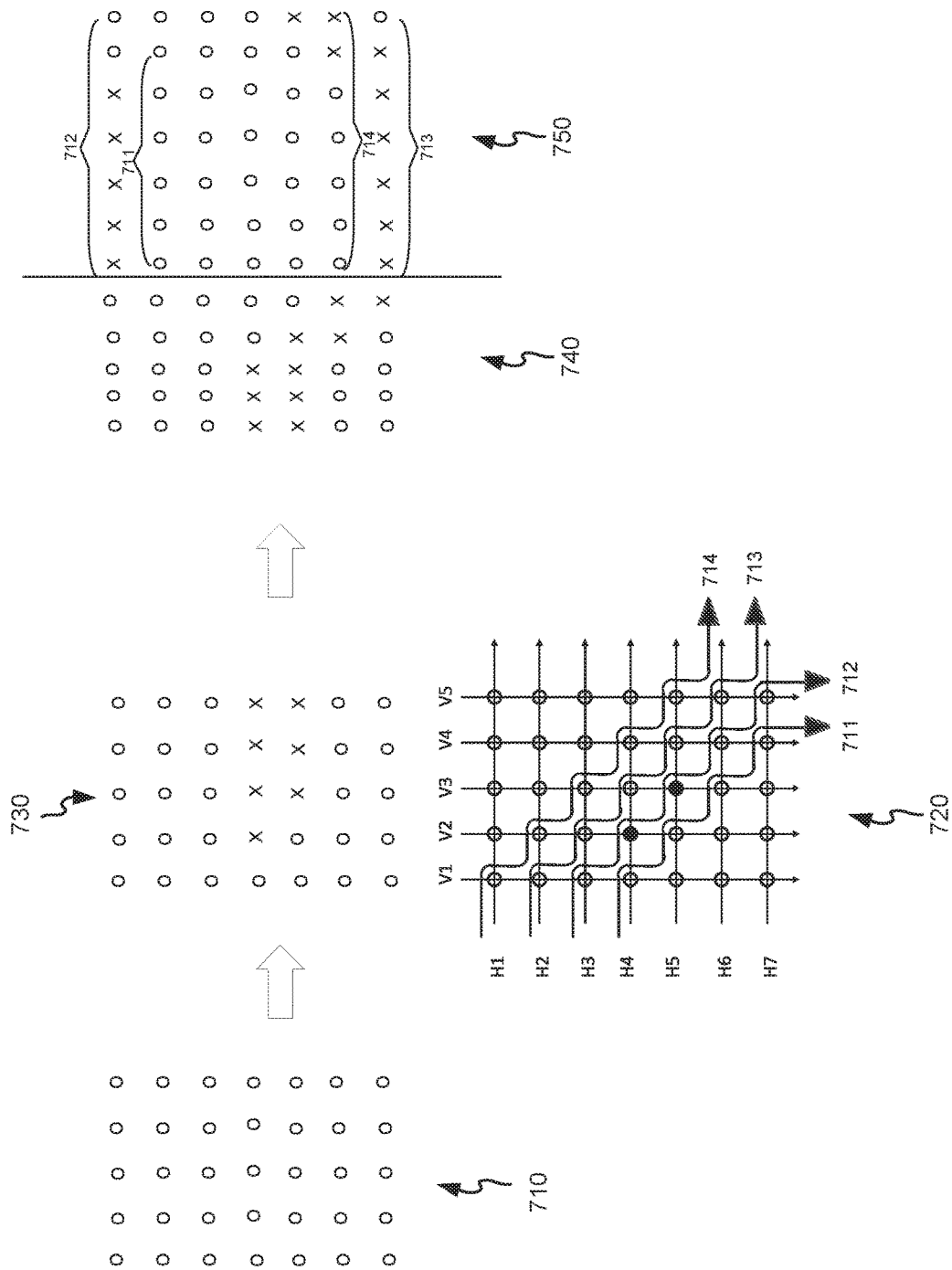
FIG. 7 illustrates an example of the pseudo-diagonal shifting process according to some embodiments of the disclosed technology.

FIG. 7 illustrates an example of the pseudo-diagonal shifting process according to some embodiments of the disclosed technology. A test pattern 710 is shifted into a two-dimensional scan architecture 720 which can perform vertical circular shifting. Like the two-dimensional scan architecture 620, the two-dimensional scan architecture 720 also has two faulty scan cells H4-V2 and H5-V3. The loaded test pattern 730 is then shifted for one clock cycle in the second direction (vertical) followed by shifting for one clock cycle in the first direction (horizontal). FIG. 7 shows the part of the chain test result 740 associated with the pseudo-diagonal shifting process. After the pseudo-diagonal shifting process, the test pattern is shifted out of the scan chains in the first direction to generate the rest of the chain test result 750. Four pseudo-diagonal shifting paths 711, 712, 713 and 714 are shown in both the two-dimensional scan architecture 720 and bits in the part 750 of the chain test result corresponding to scan cells on these four paths are also illustrated. Results of the scan paths 712 and 711 appear at the top of the chain test result due to the circular shifting associated with the two-dimensional scan architecture 720.

As shown in the two-dimensional scan architecture 720, both the pseudo-diagonal shifting paths 711 and 714 do not pass through either of the two fault scan cells H4-V2 and H5-V3, while each of the pseudo-diagonal shifting path 712 and 713 passes through both of the two fault scan cells H4-V2 and H5-V3. The result for the scan path 711 shows that the bit corresponding to scan cell H5-V2 is a good one and the result for the scan path 714 shows that the bit corresponding to scan cell H4-V3 is a good one. Therefore, the scan cells H5-V3 and H4-V2 are faulty scan cells. This demonstrates that a pseudo-diagonal shifting process can help locate faulty scan cells.

Figure 8:
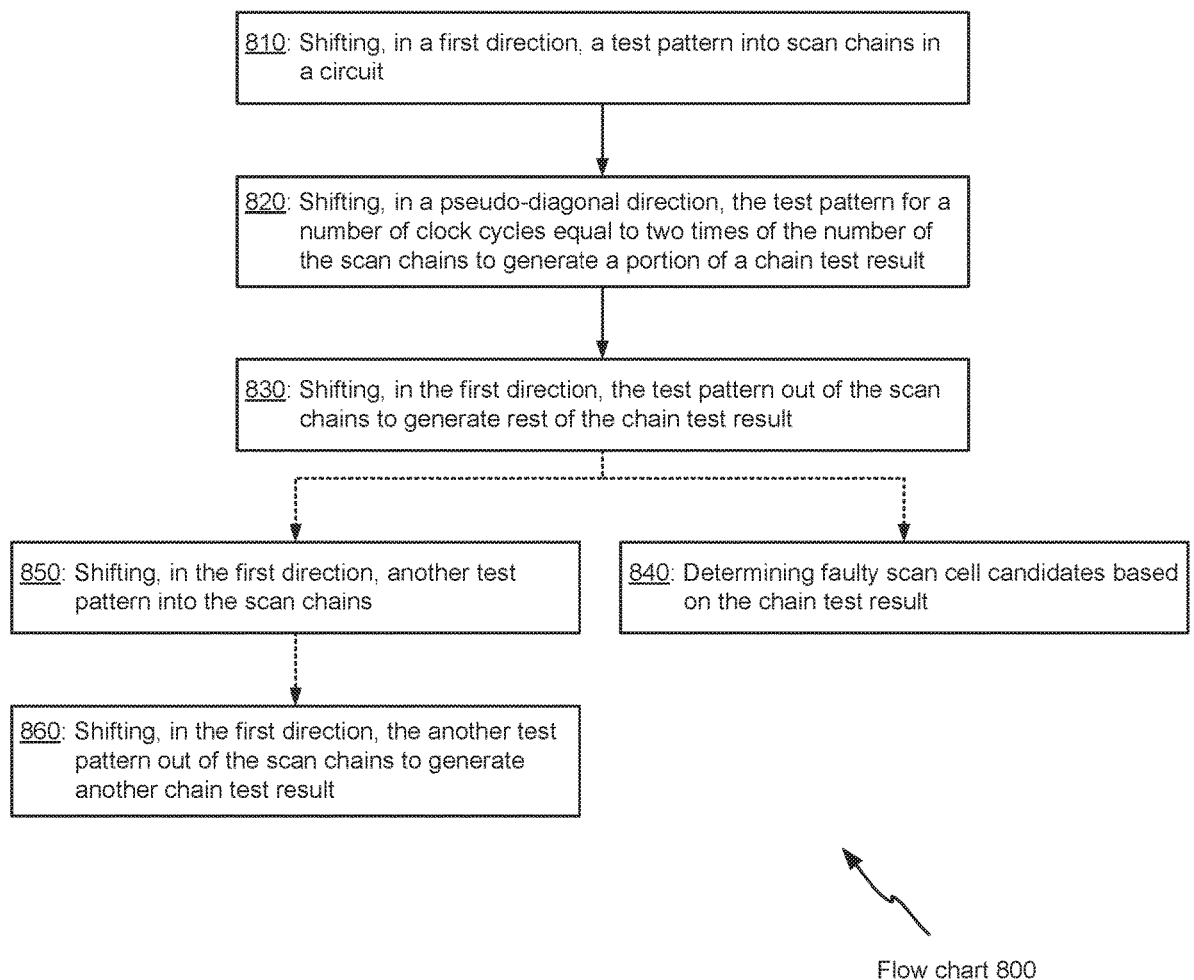
FIG. 8 illustrates another flowchart showing a process of scan chain diagnosis using a two-dimensional scan architecture that may be implemented according to some embodiments of the disclosed technology.

FIG. 8 illustrates a flowchart 800 showing another process of scan chain diagnosis using a two-dimensional scan architecture that may be implemented according to some embodiments of the disclosed technology. For ease of understanding, methods for scan chain diagnosis using a two-dimensional scan architecture that may be employed according to various embodiments of the disclosed technology will be described with reference to the two-dimensional scan architecture 200 in FIG. 2 and the flow chart 800 illustrated in FIG. 8. It should be appreciated, however, that alternate two-dimensional scan architectures may be used to perform the methods for scan chain diagnosis illustrated by the flow chart 800 according to various embodiments of the disclosed technology. Likewise, the two-dimensional scan architecture 200 may be employed to perform methods for scan chain diagnosis other than the one shown in the flow chart 800 according to various embodiments of the disclosed technology.

In operation 810, a test pattern is shifted, in the first direction, into scan chains in a circuit having the two-dimensional scan architecture 200. In operation 820, the loaded test pattern is shifted in a pseudo-diagonal direction for a number of clock cycles equal to two times of the number of the scan chains to generate a portion of chain test result. Shifting in the pseudo-diagonal direction comprises: repeating an operation of shifting the another test pattern for one clock cycle in the first direction followed by shifting for one clock cycle in the second direction or repeating an operation of shifting for one clock cycle in the second direction followed by shifting for one clock cycle in the first direction. In operation 830, the test pattern is shifted out of the scan chains to generate rest of the chain test result.

In operation 840, faulty scan cell candidates may be determined based on the chain test result. Alternatively, in operation 850, another test pattern is shifted into the scan chains in the first direction (horizontal). The another test pattern may be the same as the original test pattern used in operation 810 or a different test pattern. In operation 860, the another test pattern is shifted out of the scan chains in the first direction to generate another chain test result. Faulty scan chains and faulty scan cell candidates may then be determined based on the chain test result and the another chain test result. It should be noted that the operations 850 and 860 can be performed first, prior to the operations 810, 820 and 830.

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A method, comprising:
   shifting, in a first direction, a test pattern into scan chains in a circuit, the scan chains comprising scan cells, wherein the scan cells on each of the scan chains are further coupled to corresponding scan cells on two other scan chains in the scan chains such that data bits stored in the scan cells can be shifted circularly in a second direction orthogonal to the first direction based on a control signal;
   shifting, in the second direction, the test pattern for a number of clock cycles equal to a number of the scan chains; and
   shifting, in the first direction, the test pattern out of the scan chains to generate a chain test result.

2. The method recited in claim 1, further comprising:
   determining good scan chains and faulty scan chains based on the chain test result, the good scan chains being scan chains having no faulty scan cells; and
   identifying faulty scan cell candidates on the faulty scan chains based on part of the chain test result for one of the good scan chains.

3. The method recited in claim 2, further comprising:
   shifting, in the first direction, another test pattern into the scan chains;
   shifting, in a pseudo-diagonal direction, the another test pattern for a number of clock cycles determined based on the faulty scan cell candidates or the faulty scan chains to generate a portion of another chain test result, wherein the shifting in the pseudo-diagonal direction comprises: repeating an operation of shifting the another test pattern for one clock cycle in the first direction followed by shifting for one clock cycle in the second direction or an operation of shifting for one clock cycle in the second direction followed by shifting for one clock cycle in the first direction;
   shifting, in the first direction, the another test pattern out of the scan chains to generate rest of the another chain test result; and
   determining final faulty scan cell candidates in the faulty scan cell candidates based on the another chain test result.

4. The method recited in claim 3, wherein the test pattern and the another test pattern are identical.

5. The method recited in claim 1, further comprising:
   shifting, in the first direction, another test pattern into the scan chains;
   shifting, in a pseudo-diagonal direction, the another test pattern for a number of clock cycles equal to two times the number of the scan chains to generate a portion of another chain test result, wherein the shifting in the pseudo-diagonal direction comprises: repeating an operation of shifting the another test pattern for one clock cycle in the first direction followed by shifting for one clock cycle in the second direction or repeating an operation of shifting for one clock cycle in the second direction followed by shifting for one clock cycle in the first direction; and shifting, in the first direction, the another test pattern out of the scan chains to generate rest of the another chain test result.

6. The method recited in claim 5, further comprising:

determining good scan chains and faulty scan chains based on the chain test result, the good scan chain being a scan chain having no faulty scan cells; and determining faulty scan cell candidates on the faulty scan chains based on part of the chain test result for one of the good scan chains and the another chain test result.

7. The method recited in claim 5, wherein the test pattern and the another test pattern are identical.

8. A method, comprising:

shifting, in a first direction, a test pattern into scan chains in a circuit, the scan chains comprising scan cells, wherein the scan cells on each of the scan chains are further coupled to corresponding scan cells on two other scan chains in the scan chains such that data bits stored in the scan cells can be shifted circularly in a second direction orthogonal to the first direction based on a control signal;

shifting, in a pseudo-diagonal direction, the test pattern for a number of clock cycles equal to two times a number of the scan chains to generate a portion of a chain test result, wherein the shifting in the pseudo-diagonal direction comprises: repeating an operation of shifting the test pattern for one clock cycle in the first direction followed by shifting for one clock cycle in the second direction or repeating an operation of shifting for one clock cycle in the second direction followed by shifting for one clock cycle in the first direction; and shifting, in the first direction, the test pattern out of the scan chains to generate rest of the chain test result.

9. The method recited in claim 8, further comprising:

shifting, in the first direction, another test pattern into the scan chains; and shifting, in the first direction, the another test pattern out of the scan chains to generate another chain test result.

10. The method recited in claim 9, wherein the test pattern and the another test pattern are identical.

11. The method recited in claim 9, further comprising:

determining good scan chains and faulty scan chains based on the another chain test result, the good scan chain being a scan chain having no faulty scan cells; and determining faulty scan cell candidates on the faulty scan chains based on the chain test result.

12. The method recited in claim 8, further comprising:

determining faulty scan cell candidates based on the chain test result.

* * * * *